(12) United States Patent
Swaminathan et al.

(10) Patent No.: US 11,817,364 B2
(45) Date of Patent: Nov. 14, 2023

(54) BGA STIM PACKAGE ARCHITECTURE FOR HIGH PERFORMANCE SYSTEMS

(71) Applicant: Intel Corporation, Santa Clara, CA (US)

(72) Inventors: Rajasekaran Swaminathan, Chandler, AZ (US); Mukul Renavikar, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1140 days.

(21) Appl. No.: 16/017,582

(22) Filed: Jun. 25, 2018

(65) Prior Publication Data
US 2019/0393121 A1    Dec. 26, 2019

(51) Int. Cl.
*H01L 23/367* (2006.01)
*H01L 23/373* (2006.01)
*H01L 23/00* (2006.01)

(52) U.S. Cl.
CPC ........ *H01L 23/367* (2013.01); *H01L 23/3736* (2013.01); *H01L 24/06* (2013.01); *H01L 24/09* (2013.01); *H01L 24/17* (2013.01); *H01L 2924/014* (2013.01); *H01L 2924/0105* (2013.01); *H01L 2924/01029* (2013.01); *H01L 2924/01047* (2013.01); *H01L 2924/01049* (2013.01); *H01L 2924/01083* (2013.01); *H01L 2924/15311* (2013.01)

(58) Field of Classification Search
CPC ...... H01L 24/06; H01L 24/03; H01L 23/3736
See application file for complete search history.

(56) References Cited

U.S. PATENT DOCUMENTS 6,156,132 A * 12/2000 Yamashita ........... B23K 35/262
                                                    148/400
7,833,839 B1 * 11/2010 Touzelbaev ............ H01L 24/27
                                                    438/118

(Continued)

OTHER PUBLICATIONS

National Center for Biotechnology Information (2022). PubChem Compound Summary for CID 5359967, Indium. Retrieved Aug. 28, 2022 from https://pubchem.ncbi.nlm.nih.gov/compound/Indium. (Year: 2014).*

*Primary Examiner* — Dale E Page
*Assistant Examiner* — Abbigale A Boyle
(74) *Attorney, Agent, or Firm* — Schwabe, Williamson & Wyatt, P.C.

(57) ABSTRACT

Embodiments include semiconductor packages and methods of forming such packages. A semiconductor package includes a die on a package substrate, an integrated heat spreader (IHS) on the package substrate and above the die, and a solder thermal interface material (STIM) coupling the die to the IHS. The semiconductor package includes a low-temperature solder (LTS) paste comprising an alloy of tin and bismuth (Bi), and the LTS paste on a bottom surface of the package substrate having a ball grid array. The LTS paste may have a weight percentage of Bi greater than 35% and a melting point less than or equal to a melting point of the STIM, where the STIM includes indium. The weight percentage of Bi may be between approximately 35% to 58%. The semiconductor package may include a solder ball coupling the LTS paste on the package substrate to the LTS paste on a second package substrate.

15 Claims, 4 Drawing Sheets

(56) References Cited

U.S. PATENT DOCUMENTS

| | | | |
|---|---|---|---|
| 9,431,274 B2* | 8/2016 | Ramalingam | H01L 24/17 |
| 9,768,090 B2* | 9/2017 | Liang | H01L 23/5384 |
| 2011/0100690 A1* | 5/2011 | Yoshimura | H01B 1/026 |
| | | | 252/512 |
| 2012/0049353 A1* | 3/2012 | Osenbach | H01L 23/36 |
| | | | 257/737 |

* cited by examiner

BGA STIM PACKAGE ARCHITECTURE FOR HIGH PERFORMANCE SYSTEMS

FIELD

Embodiments relate to packaging semiconductor devices. More particularly, the embodiments relate to ball grid array (BGA) solder thermal interface material (STIM) packages having low temperature solder (LTS) paste materials and methods for forming such BGA STIM packages.

BACKGROUND

The current trend in electronics is to make electronic devices with smaller components operating at higher clock frequencies and power levels generating additional and ever-increasing heat. Semiconductor devices typically include a thermal solution such as an integrated heat spreader (IHS) which is typically disposed on a semiconductor die. Generally, an interface material such as a thermal interface material (TIM) is coupled between the die backside and the IHS. Typically, the IHS is formed of a metal and the TIM may be a polymer material (e.g., a polymer TIM (PTIM)) or a solder material (e.g., a solder TIM (STIM)), where the STIMs usually provide better thermal properties for the IHS compared to the PTIMs.

One of the main problems, however, involved with STIMs is packaging STIMs on ball grid array (BGA) packages due to the temperature hierarchy of BGA and surface-mount technology (SMT) reflows. The existing temperature hierarchy implemented on BGA IHS packages generally causes the STIM to melt and create voids during the BGA and SMT reflow processes. As such, one existing approach is to use different TIMs (e.g., PTIMs) for BGA IHS packages, even though these different TIMs typically exhibit inferior (or nonoptimzed) thermal properties which in turn may increase the thermal resistance, thermal technical defects and failures of the package.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are semiconductor packages that may enable solder thermal interface materials (STIMs) (e.g., a STIM including indium (In)) on ball grid array (BGA) packages with integrated heat spreaders (IHSs) electronic devices and a method of forming such semiconductor packages. In particular, the semiconductor packages described below and methods of forming such semiconductor packages includes a low-temperature solder (LTS) paste that may (i) couple a BGA package to a solder ball during a BGA reflow, and then (ii) couple both the BGA package and solder ball onto a surface-mount technology (SMT) package during a SMT reflow. In the embodiments described herein, a semiconductor package may implement a LTS paste having predefined weight percentage(s) of one or more material(s) (e.g., Tin (Sn), Bismuth (Bi), etc.), and a melting point that is approximately less than a melting point of the STIM—thereby eliminating (or mitigating) the STIM from melting and causing voids as a result of the melting.

Figure 1:
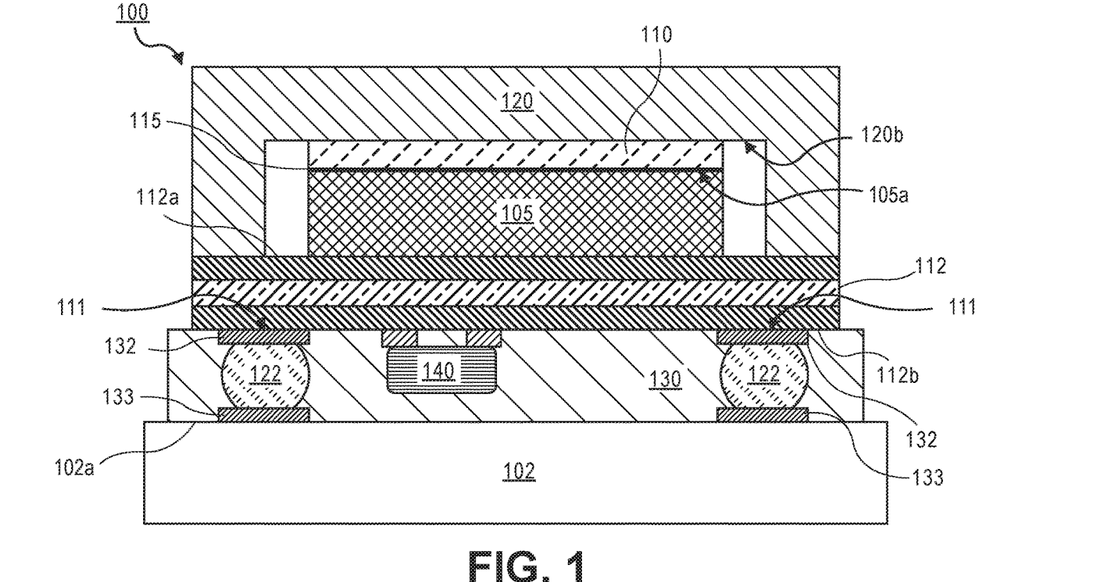
FIG. 1 is an illustration of a cross-sectional view of a semiconductor package having an integrated heat spreader (IHS), a solder thermal interface material (STIM), a die, a first package substrate, a low-temperature solder (LTS) paste, solder balls, a board-level underfill (BLUF), and a second package substrate, according to one embodiment.

According to some embodiments, a semiconductor package is described (e.g., the semiconductor package 100 illustrated in FIG. 1). For one embodiment, the semiconductor package includes a die disposed on a top surface of a package substrate. In one embodiment, the semiconductor package also includes an IHS disposed on the top surface of the package substrate, where the IHS has a bottom surface located above a top surface of the die, and where the top surface of the die may include a backside metal (BSM) layer. For another embodiment, the semiconductor package further includes a STIM coupling the top surface of the die to the bottom surface of the IHS. According to some embodiments, the semiconductor package also includes a LTS paste comprising an alloy including, but is not limited to, Sn and Bi, and the LTS paste disposed on a bottom surface of the package substrate. In other embodiments, the semiconductor package may include an additional LTS paste disposed on a top surface of a second package substrate (e.g., a printed circuit board (PCB)), a solder ball coupling the LTS paste on the bottom surface of the package substrate to the additional LTS paste disposed on the top surface of the second package substrate, and an underfill (or a board level underfill (BLUF)) disposed between the bottom surface of the package substrate and the top surface of the second package substrate, where the underfill may surround the solder ball, the LTS paste, and the additional LTS paste.

Furthermore, according to some embodiments, the LTS paste (or the alloy of the LTS paste) may include (i) a weight percentage (wt %) of the Bi that may be greater than approximately 43% (e.g., in some embodiments, the weight percentage of the Bi in the LTS paste may be between approximately 43% to 58%); and (ii) a melting point that is less than approximately a melting point of the STIM, such as the indium STIM (e.g., the melting point of the LTS paste with approximately 43% to 58% Bi may be approximately 139° Celsius (C) to 155° C., while the melting point of the STIM may be approximately between 155° C. to 157° C., as such the melting point of this LTS paste is approximately less than the melting point of this STIM).

Figure 2:
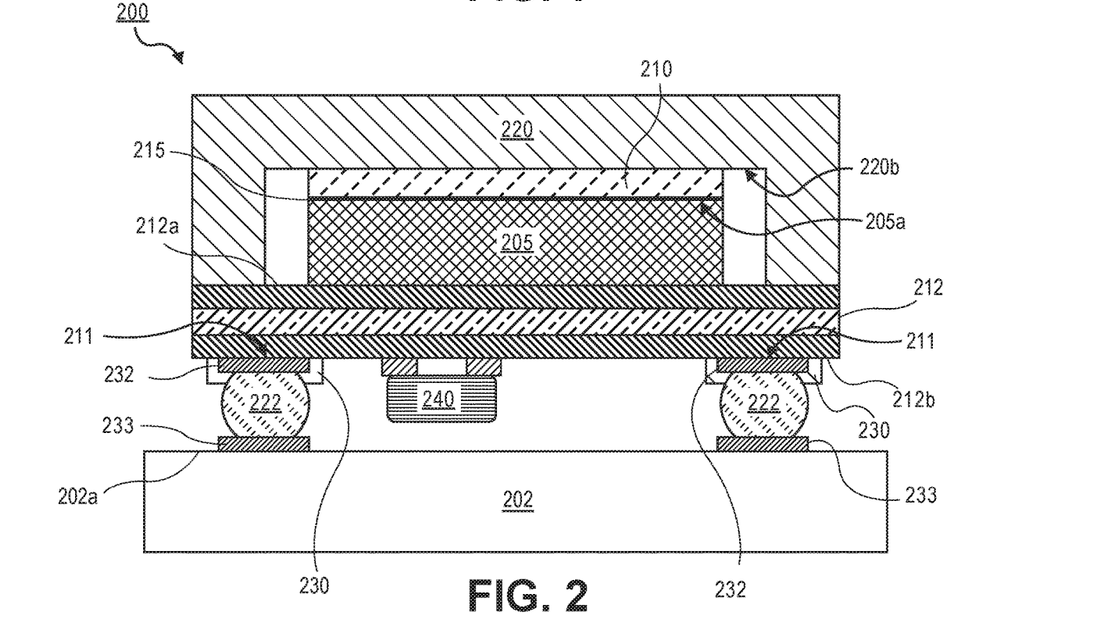
FIG. 2 is an illustration of a cross-sectional view of a semiconductor package having an IHS, a STIM, a die, a first package substrate, a LTS paste, solder balls, a LTS joint reinforced paste, and a second package substrate, according to one embodiment.

In other embodiments, an additional semiconductor package is described (e.g., the semiconductor package 200 illustrated in FIG. 2). For these embodiments, the semiconductor package includes a die disposed on a top surface of a package substrate. In these embodiments, the semiconductor package also includes an IHS disposed on the top surface of the package substrate, where the IHS has a bottom surface located above a top surface of the die, and where the top surface of the die may include a BSM layer. For these embodiments, the semiconductor package further includes a STIM coupling the top surface of the die to the bottom surface of the IHS. According to these embodiments, the semiconductor package also includes a LTS paste comprising an alloy including, but is not limited to, Sn and Bi, and the LTS paste disposed on a bottom surface of the package substrate.

In addition to these embodiments, the additional semiconductor package further includes a LTS joint reinforced paste disposed on and around the LTS paste and the bottom surface of the package substrate. For these other embodiments, the semiconductor package may include an additional LTS paste disposed on a top surface of a second package substrate, and a solder ball coupling the LTS paste and the LTS joint reinforced paste on the bottom surface of the package substrate to the additional LTS paste disposed on the top surface of the second package substrate. In these embodiments, the LTS joint reinforced paste is used to locally enhance the reinforcement of the joint between the LTS paste and the solder ball. For one embodiment, the LTS joint reinforced paste may include, but is not limited to, an epoxy, a flux, and a metal powder.

Furthermore, according to these embodiments, the LTS paste (or the alloy of the LTS paste) may include (i) a weight percentage of the Bi that may be greater than approximately 35% (e.g., in these embodiments, the weight percentage of the Bi in the LTS paste may be between approximately 35% to 58%, where in some embodiments the weight percentage of the Bi in the LTS paste may be between approximately 35% to 43%, while in other embodiments the weight percentage of the Bi in the LTS paste may be between approximately 43% to 58%); (ii) a melting point that is approximately less than or equal to a melting point of the STIM, such as the indium STIM, while in one embodiment the melting point may be approximately greater than or equal to the melting point of the STIM (e.g., the melting point of the LTS paste with approximately 35% to 58% Bi may be approximately between 139° C. to 175° C., while the melting point of the STIM with the In may be approximately 155° C. to 157° C., as such the melting point of this LTS paste may be approximately less than or equal to the melting point of this STIM, or in one embodiment approximately greater than or equal to the melting point of this STIM); and (iii) in this way, when the melting point of the STIM may be approximately greater than or equal to the melting point of the LTS paste, the STIM with the comprises a high viscosity having a minimal viscosity drop of approximately less than or equal to 4% (≤4%) at a melting point range of approximately 160° C. to 175° C.—which mitigates the STIM from melting and causing voids on the package substrate as a result of melting.

The semiconductor packages (also referred to as BGA STIM package architectures, BGA STIM package assemblies, BGA IHS packages, etc.) described herein provide electrical performance improvements for smaller/thinner electrical components (e.g., a microprocessor die) operating at higher clock frequencies and power levels—without compromising the thermal performance and requirements of the package. In addition, the embodiments of the semiconductor package improve existing packaging solutions by (i) enabling an indium STIM to be disposed on a BGA package; (ii) fine-tuning the solder metallurgy for the LTS (e.g., a Sn—Bi based LTS) to enable no or minimal melting of the STIM; (iii) optimizing the thermal performance of the BGA package: and (iv) preventing (or mitigating) melting and voids by the STIM during the BGA and SMT reflow process.

In some embodiments, the semiconductor packages facilitate the temperature hierarchy between the LTS metallurgy and the STIM materials which enables disposing an IHS and an indium STIM on a BGA package. Additional embodiments herein provide two or more semiconductor package architectures (e.g., the semiconductor package 100 of FIG. 1 and the semiconductor package of FIG. 2), where each architecture may have a controlled (or predefined) temperature hierarchy and LTS metallurgy to implement the BGA and SMT reflows of that architecture. Another major advantage of the embodiments described herein includes improving the reliability risk of the semiconductor packages by (i) lowering the temperature requirements needed for the solder ball joints, (ii) increasing the weight percentage of the Bi in the LTS paste, and (iii) enabling a LTS joint reinforced paste as an underfill (UF) solution for the interface of the LTS paste.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including a semiconductor package having an IHS, a STIM, a die, one or more package substrates, solder balls, and at least one of a LTS paste, a LTS joint reinforced paste, and a BLUF.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted FIG. 1 is an illustration of a cross-sectional view of a semiconductor package 100 having an IHS 120, a STIM 110, a die 105, a first package substrate 112, a LTS paste 132-133, a plurality of solder balls 122, a BLUF 130, and a second package substrate 102, according to some embodiment. For one embodiment, the semiconductor package 100 enables disposing the IHS 120, the STIM 110, and the die 105 on a top surface 112a of the first package substrate 112 by (i) creating/forming the LTS paste 132 (or the LTS paste material(s)), and (ii) disposing the LTS paste 132 on a bottom surface 112b of the first package substrate 112, where the bottom surface 112b includes a BGA, to couple the solder ball 122 onto the LTS paste 132 with a BGA reflow.

The semiconductor package 100 may implement a solder metallurgy (or an alloy metallurgy) to create the LTS paste 132-133, where the LTS paste 132-133 may include, for example, a Sn—Bi base lead-free solder, an increased weight percentage of Bi, and a lower melting point (or a eutectic point). As described in further detail below, the LTS paste 132-133 may facilitate the solder ball 122 attachment during the BGA and SMT reflows while preventing (or hindering) the STIM 110 from melting and causing voids, where the STIM 110 may include indium.

For one embodiment, the semiconductor package 100 may include the die 105 disposed on the top surface 112a of the first package substrate 112. The semiconductor package 100 may also include the IHS 120 disposed on the top surface 112a of the first package substrate 112, where the IHS 120 is positioned above the die 105 to dissipate the heat produced by the die 105. The IHS 120 has a bottom surface 120b located above a top surface 105a of the die 105, where the top surface 105a of the die 105 may include a BSM layer 115. For example, the BSM layer 115 may be disposed (or formed) on the top surface 105a of the die 105 (i.e., the backside of the die 105).

For another embodiment, the semiconductor package 100 further includes the STIM 110 disposed between the bottom surface 120b of the IHS 120 and the top surface 105a of the die 105. Note that, when the top surface 105a of the die 105 includes the BSM layer 115, the STIM 110 may be disposed between the bottom surface 120b of the IHS 120 and the BSM layer 115 on the die 105. In some embodiments, the STIM 110 may be coupling the IHS 120 to the die 105.

According to some embodiments, the semiconductor package 100 may also include the LTS paste 132 disposed on a bottom surface 112b of the first package substrate 112, where the bottom surface 112b comprises the BGA. In some embodiments, the LTS paste 132-133 may include an alloy and/or a lead-free alloy, where each alloy may include, but is not limited to, Sn and Bi. Additionally, in other embodiments, the LTS paste 132-133 may include the alloy and/or the lead-free alloy, where each alloy may include, but is not limited to, Sn, Bi, and one or more materials, including, but are not limited to, a LTS material, an adhesive, a filler of low temperature solder particles, and/or a solder flux. The solder flux may include rosins/resins, activators, viscosity controlling additives, chemicals, stabilizers, and/or solvents.

In some embodiments, as shown in FIG. 1, the semiconductor package 100 may include an electronic device 140 (or one or more electronic devices) disposed on the bottom surface 112b of the first package substrate 112. For one embodiment, the electronic device 140 may include, but is not limited to, passive devices (e.g., decoupling capacitors/power delivery inductors, antennas), micro-electromechanical systems (MEMS), or any other type of electrical components and/or sensors. In one embodiment, the electronic device 140 may be a discrete filtering component such as a land-side capacitor (LSC). The electronic device 140 may be coupled to the bottom surface 112b of the first package substrate 112 using solder, such as LTS (or LTS paste) or the like. The electronic device 140, for example, may then be disposed (or positioned) between the first package substrate 112 and the second package substrate 102.

Furthermore, as shown in FIG. 1, the solder ball 122 may be coupled initially to the LTS paste 132 (or the LTS BGA paste) on the BGA of the first package substrate 112 using a BGA reflow process (or the like). Additionally, the semiconductor package 100 may include the LTS paste 133 disposed on a top surface 102a of a second package substrate 102 (e.g., a printed circuit board (PCB)). Note that the LTS paste 132 may be similar to the LTS paste 133, while in alternate embodiments at least one of the LTS paste 132 and the LTS paste 133 may include one or more different materials compared to the other LTS paste.

Subsequently, the semiconductor package 100 may couple the first package substrate 112 onto the second package substrate 102 by coupling the solder ball 122 onto to the LTS paste 133 (or the LTS SMT paste) on the top surface 102a of the second package substrate 102 using a SMT reflow process (or the like). In some embodiments, the semiconductor package 100 may also include the BLUF 130 (or the underfill) disposed (or injected) between the bottom surface 112b of the first package substrate 112 and the top surface 102a of the second package substrate 102, where the BLUF 130 may surround the solder balls 122, the LTS paste 132-133, and/or any additional component/device disposed between the bottom surface 112b of the first package substrate 112 and the top surface 102a of the second package substrate 102 (e.g., the electronic component 140 disposed on the bottom surface 112b of the first package substrate 112).

For alternate embodiments, the BLUF 130 may be selectively disposed at the corners (or edges) of the first and second package substrates 112 and 102 rather than flooded in between the first and second package substrates 112 and 102. In some embodiments, the BLUF 130 may have a curing temperature of approximately 130° C. (or less than or equal to approximately 135° C.), where the curing temperature of the BLUF 130 may be less than approximately the melting point of the LTS paste 132-133 to prevent any risk of the BGA/SMT joints melting during the BLUF 130 curing process.

In some embodiments, the LTS paste 132-133 may include a weight percentage of the Bi that may be greater than approximately 43%. For example, in some embodiments, the weight percentage of the Bi in the LTS paste 132-133 may be between approximately 43% to 58%. In some embodiments, the LTS paste 132-133 may include a melting point that is approximately less than a melting point of the STIM 110 such as an indium STIM. For example, in some embodiments, the melting point of the LTS paste 132-133 having approximately 43% to 58% Bi may be approximately 139° Celsius (C.) (or greater than or equal to approximately 139° C. (e.g., approximately 139° C. to 155° C.), while the melting point of the STIM 110 may be between approximately 155° C. to 157° C. (or greater than or equal to approximately 155° C.). As such, the melting point of the LTS paste 132-133 may be less than approximately the melting point of the STIM 110, enabling BGA and SMT reflow processes of the LTS paste 132-133 and solder balls 122 of the semiconductor package 100 while eliminating (or highly reducing) the STIM 110 from melting that typically results in voiding and decreased thermal performance.

Now referring back to the IHS 120, the STIM 110, the die 105, the LTS paste 132-133, and the first and second package substrates 112 and 102—and some other additional components/processes—which are described below in further detail.

Furthermore, in some embodiments, the IHS 120 may act as a heat conductor to draw heat away from the die 105 to the outside environment. In other embodiments, the IHS 120 may be any of one or more conductive structures/materials such as a heat pipe, a heat sink, a slug, a heat spreader, and/or the like. The IHS 120 may be formed from a thermally conductive material, such as metal. For example, the IHS 120 may be formed from at least one of copper (Cu), aluminum (Al), steel, nickel (Ni), any other metal, a metal alloy, any other conductive material, and/or any combination thereof. In one embodiment, the IHS 120 may have an IHS lid disposed on a top surface of the IHS 120, where the lid may be one or more metals, such as Ni—Cu.

Furthermore, in one embodiment, the IHS 120 may be coupled to the first package substrate 112 via a sealant which may be disposed between the bottom surface of the periphery walls/edges of the IHS 120 and the top surface 112a of the first package substrate 112. For one embodiment, the sealant may be dispensed at the perimeter of the IHS 120, with a contact area limited by the area of the footprint (in the x-y dimensions) of the IHS 120. The size of this footprint area and its location are driven by package design considerations such as, but not limited to, locations of the die 105 and the size of the first package substrate 112. For some embodiments, the sealant may provide a structural/mechanical connection and a thermal coupling between the IHS 120 and the first package substrate 112. The sealant may be a sealant adhesive material(s) including one or more thermally conductive materials. The sealant may also be created using a silicone-based sealant materials or an epoxy-based sealant materials.

Furthermore, in some embodiments, the STIM 110 may act as an interface material, such as a thermal interface material (TIM), coupled between the die 105 backside and the IHS 120. For some embodiments, the IHS 120 may be created of a metal and the TIM may be a solder material, such as indium, which is used to create the STIM 110. Adhesion of the IHS 120 to the die 105 may be implemented by the STIM 110 adhering to the top surface 105a (or the backside) of the die 105 and to the bottom surface (or the die-side) 220b of the IHS 220. This STIM 210 thus acts as a joint between the IHS 120 die-side and the die 105 backside, which may include the BSM layer.

The STIM 110 may be used to facilitate thermal conduction from the die 105 to the IHS 120 and any other secondary heat exchanger (e.g., a heat sink, an ambient environment, etc.). The STIM 110 may assist with minimizing interface thermal resistance. In some embodiments, the STIM 110 may include at least one of a high thermal conductivity adhesive material, a metal based alloy with a low melting point, a metal based TIM, a polymer matrix TIM, thermal grease, any solder TIM with a low melting point, such as an indium STIM, and/or the like. For some embodiments, the STIM 110 may include approximately 99.99% indium solder (or approximately 95% to 99.99% indium solder). For alternate embodiments, the STIM 110 may be a metal based alloy layer including at least one of indium, tin, lead, silver, antimony, bismuth, zinc, cadmium, gold, copper, ruthenium, nickel, cobalt, chromium, iron, manganese, titanium, aluminum, hafnium, tantalum, tungsten, vanadium, molybdenum, palladium, platinum, and/or any combination thereof. For some embodiments, the STIM 110 may be disposed (or deposited) on the top surface 105a of the die 105 using any existing/known techniques.

Furthermore, in some embodiments, the BSM 115 may include an alloy of Ni and Cu and/or the like. The BSM 115 may be disposed on the top surface 105a of the die 105. Additionally, the BSM 115 may be disposed on the top surface 105a of the die 105 using, for example, a physical vapor deposition (PVD) and/or the like.

Furthermore, in some embodiments, the die 105 may include, but is not limited to, a semiconductor die, an electronic device (e.g., a wireless device), an integrated circuit (IC), a central processing unit (CPU), a microprocessor, a platform controller hub (PCH), a memory, and a field-programmable gate array (FPGA), peripheral component interconnect (PCI), a graphics processing unit (GPU), an on-chip system fabric, a network interface controller, a stacked die component (i.e., two or more stacked dies or chiplets), any other electronic component, and/or any combination thereof. In other embodiments, the die 105 may include at least one of any active and passive electronic device components, such as transistors, memories, capacitors, resistors, optoelectronic devices, switches, interconnects, and/or any other electronic device components.

Furthermore, in some embodiments, the first package substrate 112 may include, but is not limited to, an interposer, an active silicon substrate, a substrate, a package, a PCB, and a motherboard. For one embodiment, one or more different materials may be used to create the first package substrate 112. In certain embodiments, the first package substrate 112 may include an organic substrate further including one or more layers of polymer base material, with conducting regions for transmitting signals. In other embodiments, the first package substrate 112 may include a ceramic base material including metal regions for transmitting signals.

For one embodiment, the first package substrate 112 may be an interposer coupling the die 105 to the BGA of the first package substrate 112. The first package substrate 112 may conductively (or communicably) couple the die 105 to the second semiconductor package 102. The first package substrate 112 may include one or more organic pitch redistribution layers disposed/sandwiched between a top conductive layer having conductive features used to conductively couple the die 105 to a bottom conductive layer having conductive features, such as pads 111 (or BGA pads), used to conductively couple the first package substrate 112 to the second package substrate 102 via the solder ball 122.

For example, as described above, the bottom surface 112b of the first package substrate 112 includes such pads 111. In some of these embodiments described above, disposing the LTS paste 132 may be implemented by disposing the LTS paste 132 on a pad 111 located on the bottom surface 112b of the first package substrate 112. In these embodiments, the LTS paste 132 may be used to create a low-temperature joint between the pad 111 of the first package substrate 112 and the solder ball 122. In some embodiments, the LTS paste 132-133 may be disposed on the pads 111 of the first and second package substrates 112 and 102, respectively, using a print process or the like. The print process may dispose (or deposit) the LTS paste 132-133 directly onto the pads 111 of the first and second package substrates 112 and 102, respectively, through openings that expose the pads 111. Furthermore, a ball mount process (or the like) may be implemented to position the solder balls 112 above or within openings directly over the LTS paste 132-133.

In some embodiments, the pad 111 may include Cu, though in other embodiments the pad 111 may include one or more other electrically or thermally conductive material(s) such as Ni, gold (Au), palladium (Pd), platinum (Pt), or alloys thereof. Additionally, for one embodiment, the pad 111 may have a surface treatment (or a surface finish) disposed on an outer (or exposed) surface of the pad 111 and positioned between the pad 111 and the LTS paste 132. The surface finish may include a material such as Ni, Pd, Au, Cu, or an organic solderability preservative.

For another embodiment, the first package substrate 112 may be a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 112. For one embodiment, the PCB 112 may also include conductive layers that comprise copper lines/traces, metallic pads, vias, via pads, planes, and/or holes.

Additionally, the first package substrate 112 may be an active silicon substrate. The active silicon substrate may include, but is not limited to, any number of conductively coupled, connected, and/or configurable circuits, electrical components, conductive structures, logic elements, and/or semiconductor devices. The active silicon substrate may include any number and/or combination of conductive and/or dielectric layers. The first package substrate 112 may also include electronic structures formed thereon or thereof that may be used to couple the die 105 to the second package substrate 102. Note that, in alternate embodiments, the first package substrate 112 may include other methods of connectivity packaging that may also be used, such as pin grid array (PGA) or land grid array (LGA).

Furthermore, in some embodiments, the solder ball 122 may include an alloy. In particular, in some embodiments, the solder ball 122 may include an alloy of Sn, silver (Ag), and Cu (SAC). For other embodiments, the solder ball 122 may be created of an alloy comprising at least one of Sn and antimony (Sb), off-eutectic Sn and Cu, a SAC shell ball with a Cu core, a SAC shell ball with a polymer core, or some other type of solder ball, for example, having a relatively high melting point. In some embodiments, the solder ball 122 may be a lead-free solder ball. In some embodiments, the melting point of the solder ball 122 may be approximately 217° C. In other embodiments, the melting point of the solder ball 122 may be greater than or equal to approximately 217° C. (e.g., for approximately 240° C. or higher). In other embodiments, the melting point of the solder ball 122 may be between approximately 190° C. to 280° C. As used herein, the melting point of the solder ball 122 (or the alloy or material that comprises the solder ball 122) may be referred to as a "relatively high" melting point to distinguish the melting point of the solder ball 122 from a melting point of the LTS paste 132-133 and the STIM 110.

Furthermore, as described above, the LTS paste 132-133 may be a LTS Sn—Bi based alloy having an increased (or higher) weight percentage of Bi, where in some embodiments the weight percentage of Bi (e.g., 58% Bi) is greater than a weight percentage of Sn (e.g., approximately ≤42% Sn). In other embodiments, the LTS paste 132-133 may include an alloy of SnBiNiCu, SnBiCuSb, SnAgBi, SnIn, SnInBi, or some other combination of bismuth and some other alloy with a relatively low melting point as compared to the melting point of the STIM 110 and the solder ball 122. In some embodiments, the LTS paste 132-133 may be a lead-free LTS material (or paste, powder, etc.). For some embodiments, the LTS paste 132-133 may have a melting point of approximately 139° C. In other embodiments, the LTS paste 132-133 may have a melting point between approximately 139° C. to 155° C. For one embodiment, the LTS paste 132-133 may have a melting point of approximately 139° C. or less.

Note that, in some embodiments, the semiconductor package 100 may implement a desired temperature hierarchy where the melting point of the LTS paste 132-133 may be between approximately 10° C. to 15° C. less than (or below) the melting point of the STIM 110 to prevent the STIM 110 from melting, causing voids, and decreasing the overall thermal performance. Also note that, in other embodiments, the semiconductor package 100 may include another temperature hierarchy where the selected one or more materials of the STIM 110 (e.g., the indium STIM) have a relatively low viscosity drop (e.g., a viscosity drop of less than or equal to approximately 4%) based on the low melting point (or low melting point range) of the LTS paste 132-133.

By using the LTS paste 132-133 with a melting point that is approximately less than that of the STIM 110, a reflow process of the LTS paste 132-133 may be controlled such that the temperature of the reflow process is approximately greater than the melting point of the LTS paste 132-133 and approximately less than the melting point of the STIM 110. Specifically, in some embodiments, the reflow process may include heating the LTS paste 132-133 through direct application of an increased temperature and/or pressure such that the LTS paste 132-133 liquefies or melts. This direct application of controlled heat enables a liquefaction/reflow process that allows the LTS paste 132-133 and the solder ball 122 to form the BGA and SMT joints used to couple the first and second package substrates 112 and 102—while the STIM 110 may not (or may not significantly) liquefy, melt or otherwise deform. For example, if a BGA/SMT reflow process at approximately 150° C. to 155° C. is/are performed, then the LTS 132-133 paste may melt and chemically/physically couple to (or bond with) the solder ball 122 and/or the pad(s) 111 of the first and second package substrates 112 and 102—while the STIM 110 may be prevented (or mitigated) from melting and/or causing voids.

Furthermore, in some embodiments, the second package substrate 102 may include, but is not limited to, a package, a substrate, a PCB, and a motherboard. Note that, in some embodiments, the second package substrate 102 may be similar to the first package substrate 112. For one embodiment, the second package substrate 102 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 102. For one embodiment, the PCB 102 may also include conductive layers that comprise copper lines/traces, metallic pads, vias, via pads, planes, and/or holes.

Furthermore, in some embodiments, the BLUF 130 may include a highly thermally conductive epoxy and/or an underfill material. The BLUF 130 materials (or layers) may include one or more polymers that are injected between the package substrates 112 and 102. The BLUF 130 may be effectively disposed/injected (or cured) at approximately 130° C. which is less than both the melting points of the LTS paste 132-133, the solder balls 122, and the STIM 110.

Note that the semiconductor package 100 of FIG. 2 may include fewer or additional packaging components based on the desired packaging design.

FIG. 2 is an illustration of a cross-sectional view of a semiconductor package 200 having an IHS 220, a STIM 210, a die 205, a first package substrate 212, a LTS paste 232-233, a plurality of solder balls 222, a LTS joint reinforced paste 230, and a second package substrate 202, according to some embodiment. For one embodiment, the semiconductor package 200 also enables disposing the IHS 220, the STIM 210, and the die 205 on a top surface 212a of the first package substrate 212 by (i) creating the LTS paste 232 and the LTS joint reinforced paste 230, (ii) disposing the LTS paste 232 on a bottom surface 212b of the first package substrate 212, where the bottom surface 212b includes a BGA, and (iii) disposing the LTS joint reinforced paste 230 on and around the LTS paste 232a and the bottom surface 212b of the first package substrate 212 to reinforce and securely couple the solder ball 222 onto the LTS paste 232 and the LTS joint reinforced paste 230 with a BGA reflow.

Note that, according to some embodiment, the semiconductor package 200 is similar to the semiconductor package 100 of FIG. 1. As such, the IHS 220, the STIM 210, the BSM layer 215, the die 205, the first and second package substrates 212 and 202, the LTS paste 232-233, and the solder balls 222 may be created similarly to the IHS 120, the STIM 110, the BSM layer 115, the die 105, the first and second package substrates 112 and 102, the LTS paste 132-133, and the solder balls 122 of FIG. 1 as described above. In addition, similar to the semiconductor package 100 of FIG. 1 described above, the semiconductor package 200 may also implement a solder metallurgy to create (i) the LTS paste 232-233 including, for example, a Sn—Bi base lead-free solder, an increased weight percentage of Bi, and a lower melting point; and (ii) the LTS joint reinforced paste 230 including, for example, an epoxy, a flux, and a metal powder. As described in further detail below, the LTS paste 232-233 may facilitate the solder ball 222 attachment during the BGA and SMT reflows, and the LTS joint reinforced paste 230 may locally enhance the reinforcement of the joint between the LTS paste 232, the solder ball 222, and the BGA of the first package substrate 212—while preventing the STIM 210 (e.g., the indium STIM) from melting and causing voids.

For one embodiment, the semiconductor package 200 may include the die 205 disposed on the top surface 212a of the first package substrate 212, where, for example, the first package substrate 212 may be an interposer. The semiconductor package 200 may also include the IHS 220 disposed on the top surface 212a of the first package substrate 212, where the IHS 220 is positioned above the die 205 to dissipate the heat produced by the die 205. The IHS 220 has a bottom surface 220b located above a top surface 205a of the die 205, where the top surface 205a of the die 205 may include a BSM layer 215. For example, the BSM layer 215 may be disposed on the top surface 205a of the die 205.

For another embodiment, the semiconductor package 200 further includes the STIM 210 disposed between the bottom surface 220b of the IHS 220 and the top surface 205a of the die 205. Note that, when the top surface 205a of the die 205 includes the BSM layer 215, the STIM 210 may be disposed between the bottom surface 220b of the IHS 220 and the BSM layer 215 on the die 205. In some embodiments, the STIM 210 may be coupling the IHS 220 to the die 205.

According to some embodiments, the semiconductor package 200 may also include the LTS paste 232 disposed on a bottom surface 212b of the first package substrate 212, where the bottom surface 212b comprises the BGA. In some embodiments, the LTS paste 232-233 may include an alloy and/or a lead-free alloy, where each alloy may include, but is not limited to, Sn and Bi. Additionally, in other embodiments, the LTS paste 232-233 may include the alloy and/or the lead-free alloy, where each alloy may include, but is not limited to, Sn, Bi, and one or more materials, including, but are not limited to, a LTS material, an adhesive, a filler of low temperature solder particles, and/or a solder flux. The solder flux may include rosins/resins, activators, viscosity controlling additives, chemicals, stabilizers, and/or solvents.

In addition to these embodiments, the semiconductor package 200 further includes the LTS joint reinforced paste 230 disposed on and around the LTS paste 232 and the bottom surface 212b of the package substrate 212. The LTS joint reinforced paste 230 may be disposed on and around the LTS paste 232 after, for example, the LTS paste 232 is disposed on the bottom surface 212b of the first package substrate 212. For one embodiment, the LTS joint reinforced paste 230 may include, but is not limited to, an epoxy, a metal powder of one or more metallic materials, and/or a flux, where the flux may include, but is not limited to, rosins/resins, activators, viscosity controlling additives, chemicals, stabilizers, and/or solvents.

Furthermore, as shown in FIG. 2, the solder ball 222 may be coupled initially to the LTS paste 232, the LTS joint reinforced paste 230, and a pad 211 on the BGA of the first package substrate 212 using a BGA reflow process (or the like). In these embodiments, the LTS joint reinforced paste 230 may be used to locally enhance the reinforcement of the joint between the LTS paste 232, the solder ball 222, and the pad 211 on the first package substrate 212. In some embodiments, the LTS joint reinforced paste 230, the solder balls 220, and the LTS paste 232 may collectively melt during the BGA reflow process and form a hybrid SAC-LTS joint on the BGA pad 211 of the first package substrate 212. In some embodiments, the hybrid SAC-LTS joint may have a melting temperature of less than or equal to approximately 175° C.

Additionally, the semiconductor package 200 may include the LTS paste 233 disposed on a top surface 202a of a second package substrate 202 (e.g., a PCB). Note that the LTS paste 232 may be similar to the LTS paste 233 but, in alternate embodiments, either of the LTS paste 232 or the LTS paste 233 may include one or more different materials as compared to the other LTS paste. Subsequently, the semiconductor package 200 may couple the first package substrate 212 onto the second package substrate 202 by coupling the solder ball 222 onto to the LTS paste 233 on the top surface 202a of the second package substrate 202 using a SMT reflow process (or the like). In some embodiments, the semiconductor package 200 may include a BLUF (e.g., similar to the BLUF 130 of FIG. 1) disposed (or injected) between the bottom surface 212b of the first package substrate 212 and the top surface 202a of the second package substrate 202, where the BLUF may surround the solder balls 222, the LTS paste 232-233, the LTS joint reinforced paste 230, and/or any additional component/device disposed between the bottom surface 212b of the first package substrate 212 and the top surface 202a of the second package substrate 202 (e.g., the electronic component 240 disposed on the bottom surface 212b of the first package substrate 212).

For alternate embodiments, the BLUF may be selectively disposed at the corners (or edges) of the first and second package substrates 212 and 202 rather than flooded in between the first and second package substrates 212 and 202. In some embodiments, the BLUF may have a melting point of approximately 130° C. (or less than or equal to approximately 130° C.), where the melting point of the BLUF may be less than approximately the melting point of the LTS paste 232-233 and the LTS joint reinforced paste 230. Note that, in other embodiments, the semiconductor package 200 may not include a BLUF as shown in FIG. 2.

Furthermore, in some embodiments, the LTS paste 232-233 may include a weight percentage of the Bi that may be greater than approximately 35%. For example, in some embodiments, the weight percentage of the Bi in the LTS paste 232-233 may be between approximately 35% to 58%. In particular, in some embodiments, the weight percentage of the Bi in the LTS paste 232-233 may be between approximately 35% to 43%. In other alternate embodiments, the weight percentage of the Bi in the LTS paste 232-233 may be between approximately 43% to 58%.

Additionally, in some embodiments, the LTS paste 232-233 may include a melting point that is less than or equal to approximately a melting point of the STIM 210 such as an indium STIM. For example, in some embodiments, the melting point of the LTS paste 232-233 having approximately 35% to 58% Bi may be between approximately 139° C. to 175° C., while the melting point of the STIM 210 may be between approximately 155° C. to 157° C. In some other alternate embodiments, the melting point of the LTS paste 232-233 having approximately 35% to 43% Bi may be between approximately 139° C. to 175° C. (or approximately ≤175° C.), which may be similar to the melting point of the hybrid SAC-LTS joint that is less than or equal to approximately 175° C. As such, in some embodiments, the melting point of the LTS paste 232-233 may be less than or equal to approximately the melting point of the STIM 210, while in alternate embodiments the melting point of the LTS paste 232-233 may be greater than or equal to approximately the melting point of the STIM 210. Note that, in some embodiments, the LTS paste 232-233 may have a melting point that is approximately equal to a melting point of the LTS joint reinforced paste 230. In other embodiments, the melting point of the LTS paste 232-233 may be different than the melting point of the LTS joint reinforced paste 230.

Accordingly, in these alternate embodiments as the melting point of the STIM 210 may be greater than or equal to approximately the melting point of the LTS paste 232-233, the STIM 210 includes a high viscosity and a viscosity drop of roughly less than or equal to approximately 4% (≤4%) at a melting point range of approximately 160° C. to 175° C. As such, in these embodiments of the semiconductor package 200, the temperature hierarchy of the melting points of the LTS paste 232-233, the LTS joint reinforced paste 230, and the STIM 210 also enable BGA and SMT reflow processes of the LTS paste 232-233, the LTS joint reinforced paste 230, and solder balls 222 of the semiconductor package 200 (e.g., at a reflow temperature of less than or equal to approximately 175° C.)—while the minimal viscosity drop of the STIM 210 (i.e., approximately ≤4% STIM viscosity drop at a melting point range of approximately ≤175° C.) helps to prevent (or highly minimize) the STIM 210 from melting which typically results in voiding and decreased thermal performance.

Note that the semiconductor package 200 of FIG. 2 may include fewer or additional packaging components based on the desired packaging design.

Figure 3:
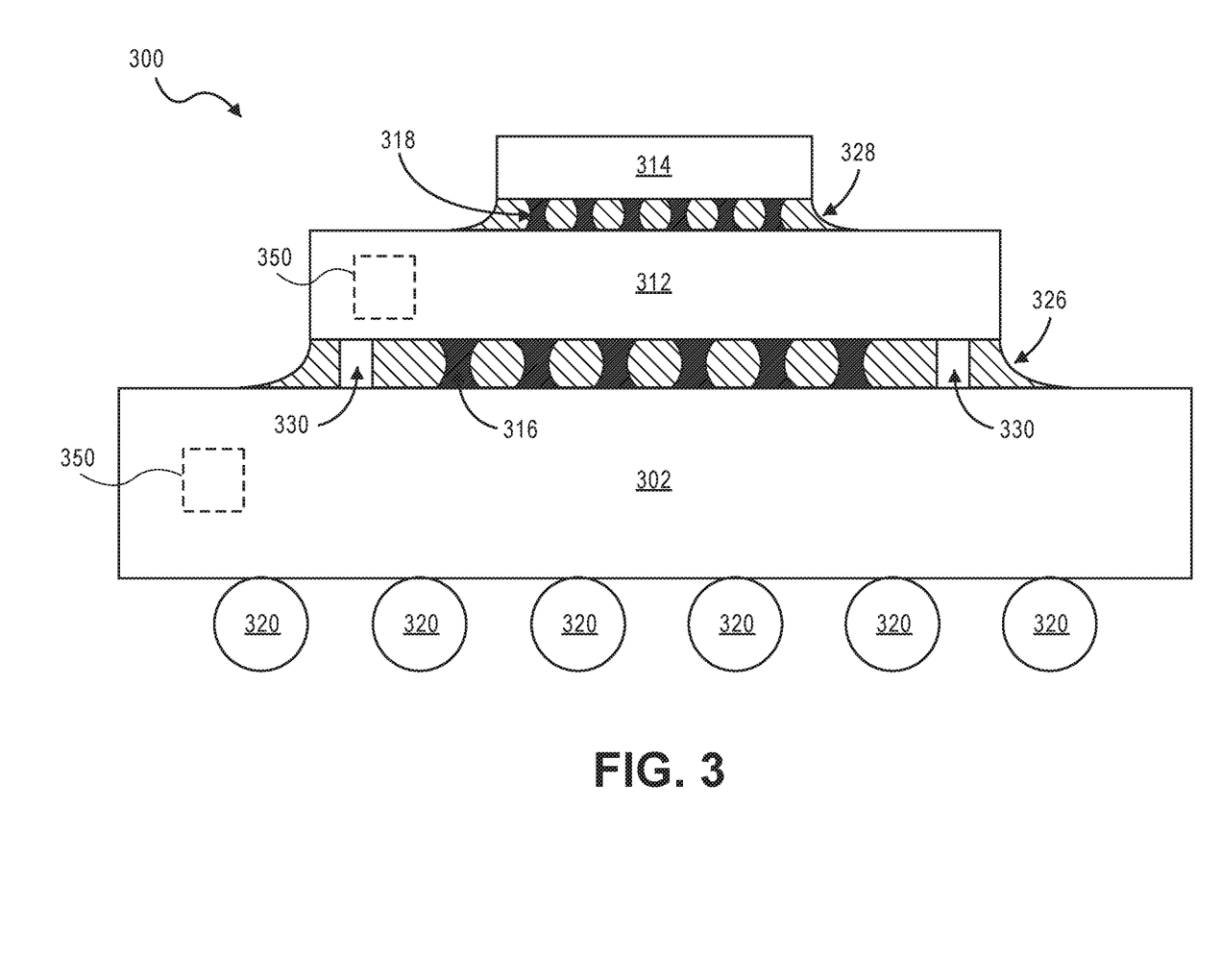
FIG. 3 is an illustration of a cross-sectional view of a semiconductor packaged system including a die, a substrate, and a package substrate, where the substrate and/or the package substrate includes at least one of the LTS paste and the LTS joint reinforced paste, according to one embodiment.

FIG. 3 is an illustration of a cross-sectional view of a semiconductor packaged system 300 including a die 314, a substrate 312 (or an interposer), interconnect structures (e.g., the plurality of bumps disposed below the die 314 and the substrate 312), and a package substrate 302, where the substrate 312 and/or the package substrate 302 may include a BGA STIM package assembly 350 as described herein. Note that the semiconductor packaged system 300 is not limited to the illustrated packaged system, and thus may be designed/formed with fewer, alternate, or additional packaging components, and/or with different materials and/or interconnecting structures.

For some embodiments, the semiconductor packaged system 300 may use one or more BGA STIM package assemblies 350 which may be similar to the semiconductor packages 100 and 200 of FIGS. 1-2. In some embodiments, the semiconductor packaged system 300 may include the BGA STIM package assemblies 350 (or BGA STIM semiconductor packages as described above) to improve, for example, the thermal properties of the system 300 by eliminating (or mitigating) a STIM from melting and causing voids.

According to some embodiments, a BGA STIM package assembly 350 may include, but is not limited to, an IHS, a STIM, a die, a LTS paste, solder balls (or bumps), a BLUF, a LTS joint reinforced paste, and one or more package substrates (which may include the substrate 312 and/or the package substrate 302). Note that the package substrate 302 and/or the substrate 312 may be similar to the package substrates 102 and 112 of FIG. 1 and/or the package substrates 202 and 212 of FIG. 2. For some embodiments, the one or more BGS STIM package assemblies 350 enable the semiconductor packaged system 300 to use STIMs, such as indium STIMs, on thin BGA packages/devices needing improved thermal properties/solutions.

According to one embodiment, the semiconductor packaged system 300 is merely one example of an embodiment of a semiconductor package. For one embodiment, the semiconductor package 300 may include one or more of a BGA package, a LGA package, and/or a PGA package. For one embodiment, a die 314 (or an integrated circuit die) is coupled to a substrate 312 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 314, the substrate 312, and the package substrate 302 may be coupled using anisotropic conductive film (ACF). For one embodiment, the substrate 312 may be, but is not limited to, a silicon interposer and/or a die with through silicon vias (TSVs). For an alternate embodiment, the semiconductor package 300 may omit the interposer/substrate 312.

For some embodiments, the semiconductor package 300 may have the die 314 disposed on the interposer 312, where both the stacked die 314 and interposer 312 are disposed on a package substrate 302. According to some embodiments, the package substrate 302 may include, but is not limited to, a package, a substrate, a PCB, and a motherboard. For one embodiment, the package substrate 302 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 302. For one embodiment, the PCB 302 may also include conductive layers that comprise copper lines/traces, metallic pads, vias, via pads, planes, and/or holes.

For one embodiment, the die 314 may include, but is not limited to, a semiconductor die, an electronic device, an IC, a CPU, a microprocessor, a PCH, a memory, and a FPGA. The die 314 may be formed from a material such as silicon and have circuitry thereon that is to be coupled to the substrate 312. Although some embodiments are not limited in this regard, the package substrate 302 may in turn be coupled to another body, for example, a computer motherboard. One or more connections between the package substrate 302, the substrate 312, and the die 314—e.g., including some or all of bumps 316, 318, and 320—may include one or more interconnect structures and underfill layers 326 and 328. In some embodiments, these interconnect structures (or connections) may variously comprise an alloy of Ni, Pd, and Sn (and, in some embodiments, Cu).

Connections between the package substrate 302 and another body may be made using any suitable structure, such as the illustrative bumps 320 shown. The package substrate 302 may include a variety of electronic structures formed thereon or thereof. The substrate 312 may also include electronic structures formed thereon or thereof, which may be used to couple the die 314 to the package substrate 302. For one embodiment, one or more different materials may be used for forming the package substrate 302 and the substrate 312. In certain embodiments, the package substrate 302 is an organic substrate made up of one or more layers of polymer base material, with conducting regions for transmitting signals. In certain embodiments, the substrate 312 is made up of a ceramic base material including metal regions for transmitting signals.

Although some embodiments are not limited in this regard, the semiconductor package 300 may include gap control structures 330—e.g., positioned between the package substrate 302 and the substrate 312. Such gap control structures 330 may mitigate a change in the height of the gap between the package substrate 302 and the substrate 312, which otherwise might occur during reflowing while die 314 is attached to substrate 312. Note that the semiconductor package 300 may include an underfill material 328 between the substrate 312 and the die 314, and an underflow material 326 between the package substrate 302 and the substrate 312. For one embodiment, the underfill materials (or layers) 326 and 328 may be one or more polymers that are injected between the layers. For other embodiments, the underfill materials may be molded underfills (MUF).

Note that the semiconductor packaged system 300 may include fewer or additional packaging components based on the desired packaging design.

Figure 4:
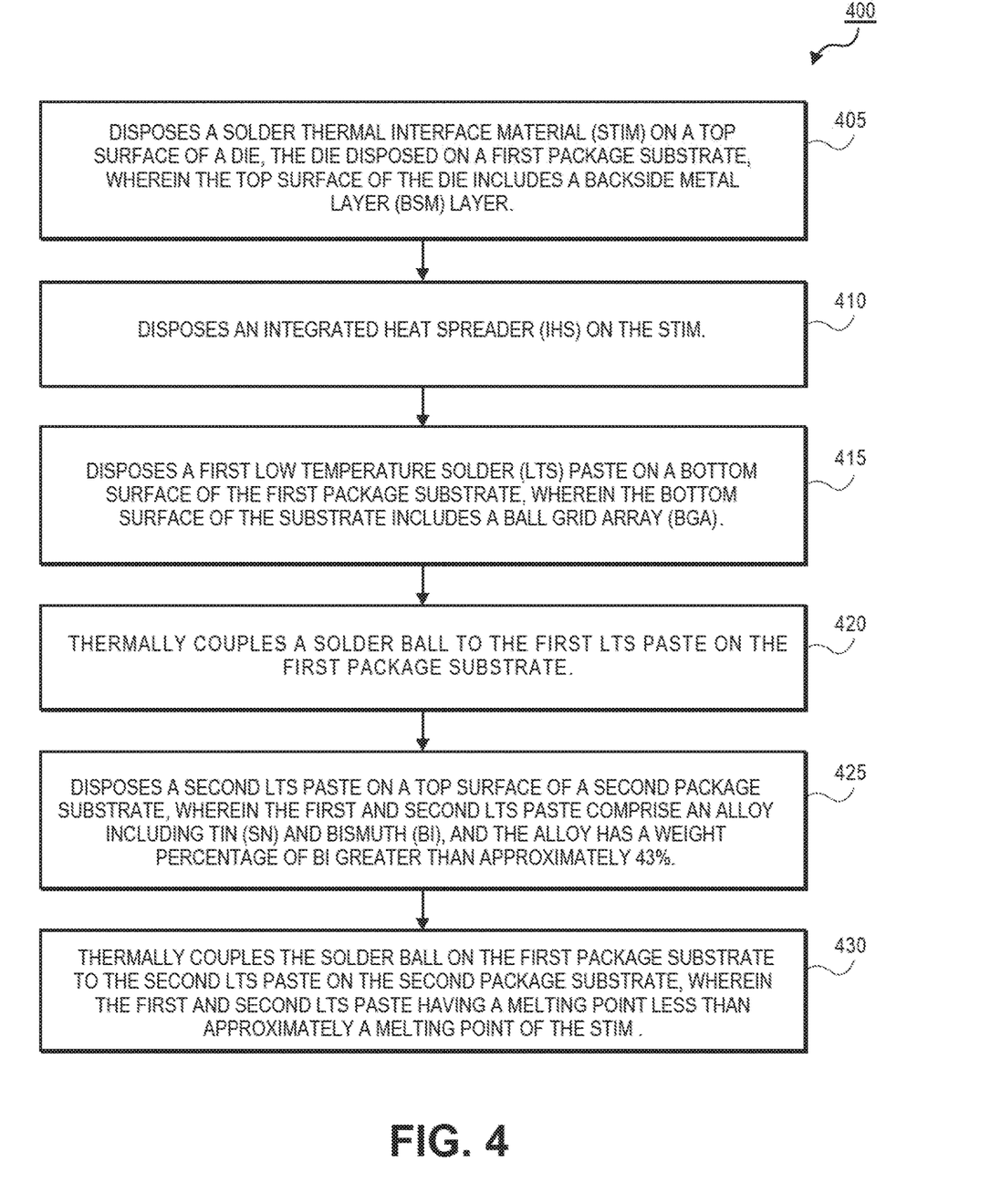
FIG. 4 is a process flow illustrating a method of forming a semiconductor package having an IHS, a STIM, a die, a first package substrate, a LTS paste, solder balls, a BLUF, and a second package substrate, according to one embodiment.

FIG. 4 is a process flow 400 illustrating a method of forming a semiconductor package having an IHS, a STIM, a die, a substrate, a LTS paste, solder balls, a BLUF, and a package substrate, according to one embodiment. For one embodiment, the process flow 400 includes one or more steps used to create a semiconductor package having a BGA STIM assembly as described herein (e.g., the semiconductor packages 100 and 200 of FIGS. 1-2).

According to one embodiment, the process flow 400 may be similar to a process flow used to create the semiconductor packages as shown in FIGS. 1-2. Specifically, the process flow 400 may be used (i) to assemble (or stack) an IHS, a STIM, a BSM layer, and a die respectively on a BGA package substrate (e.g., an interposer), and (ii) to then couple the BGA package substrate to another package substrate (e.g., a PCB) with a LTS paste having one or more materials that enable a controlled/predefined temperature hierarchy to prevent (or mitigate) the STIM from melting and causing voids during the BGA/SMT reflow processes.

At block 405, the process flow 400 disposes a solder thermal interface material (STIM) on a top surface of a die, wherein the die is disposed on a top surface of a first package substrate, and wherein the top surface of the die includes a backside metal layer (BSM) layer (e.g., as shown in FIG. 1). At block 410, the process flow 400 disposes an integrated heat spreader (IHS) on the STIM (e.g., as shown in FIG. 1). At block 415, the process flow 400 disposes a first low temperature solder (LTS) paste on a bottom surface of the first package substrate, wherein the bottom surface of the substrate includes a ball grid array (BGA) (e.g., as shown in FIG. 1).

At block 420, the process flow 400 thermally couples a solder ball to the first LTS paste on the first package substrate (e.g., as shown in FIG. 1). At block 425, the process flow 400 disposes a second LTS paste on a top surface of a second package substrate, wherein the first and second LTS paste comprise an alloy including Sn and Bi, and the alloy having a weight percentage of Bi greater than approximately 43% (e.g., as shown in FIG. 1). At block 430, the process flow 400 thermally couples the solder ball on the first package substrate to the second LTS paste on the second package substrate, wherein the first and second LTS paste having a melting point less than approximately a melting point of the STIM (e.g., as shown in FIG. 1).

In additional embodiments, the process flow may dispose an underfill (or BLUF) between the bottom surface of the first package substrate and the top surface of the second package substrate, wherein the underfill surrounds the first LTS paste, the second LTS paste, and the solder ball (e.g., as shown in FIG. 1). In some embodiments, the process flow may create the LTS paste having a weight percentage of Bi that may be between approximately 43% to 58%. For some embodiments, the process flow may create the LTS paste having a melting point that is less than approximately a melting point of the STIM, wherein the STIM is an indium STIM, and wherein a melting point of the STIM may be between approximately 155° C. to 157° C. (e.g., as shown in FIG. 1).

In additional embodiments, the process flow may create and dispose a LTS joint reinforced paste on and around the LTS paste and the bottom surface of the package substrate (e.g., as shown in FIG. 2). For these additional embodiments, the process flow may thermally couple a solder ball to both the LTS paste and the LTS joint reinforced paste on the bottom surface of the first package substrate (e.g., as shown in FIG. 2). The process flow may use the LTS joint reinforced paste to locally enhance the reinforcement of the joint between the LTS paste and the solder ball on the first package substrate. For one embodiment, the process flow may create the LTS joint reinforced paste to include an epoxy, a flux, and a metal powder.

Note that the antenna formed by process flow 400 may include fewer or additional packaging components based on the desired packaging design.

Figure 5:
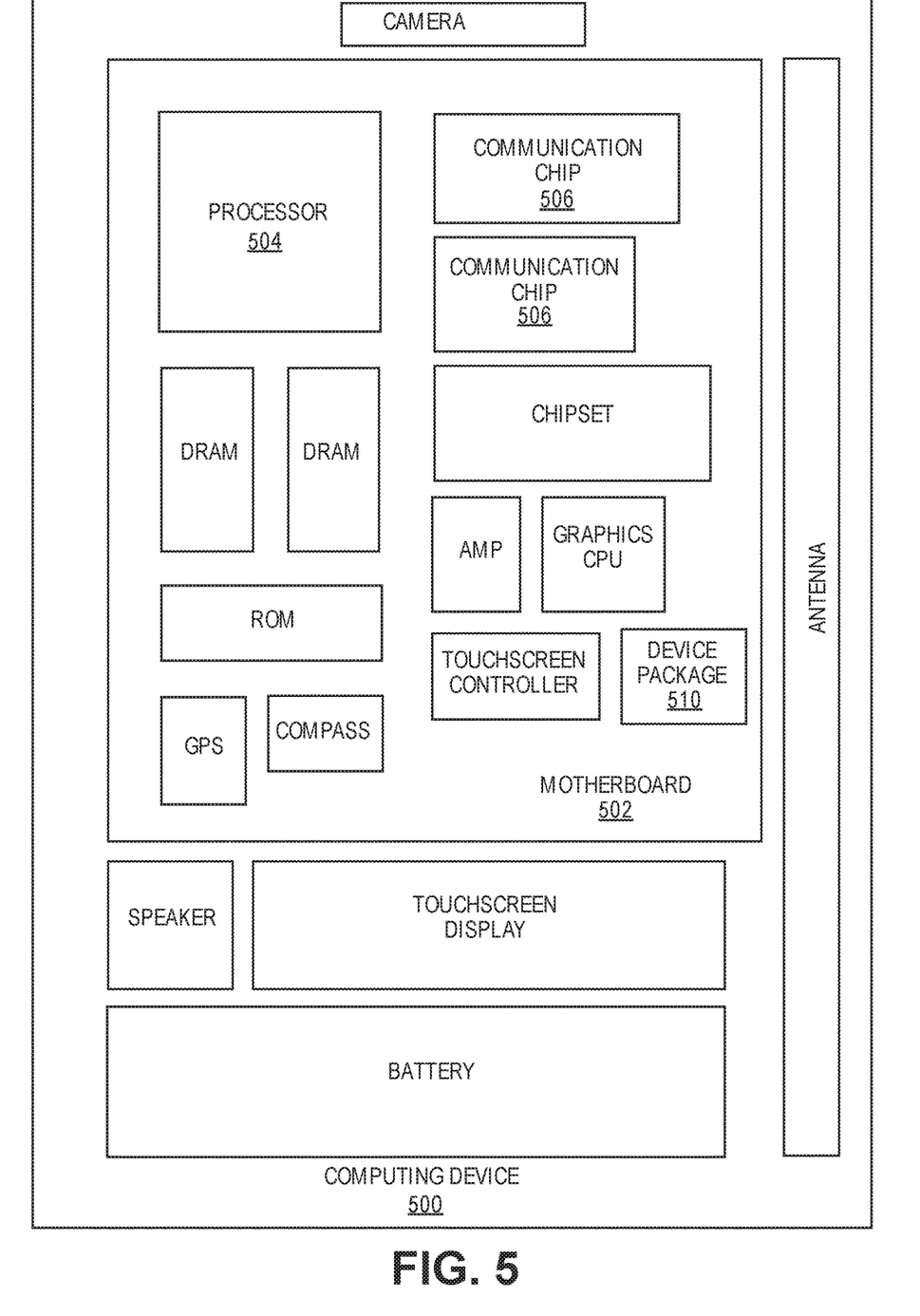
FIG. 5 is a schematic block diagram illustrating a computer system that utilizes a semiconductor package having an IHS, a STIM, a die, a first package substrate, a LTS paste, solder balls, a BLUF, and a second package substrate, according to one embodiment.

FIG. 5 is a schematic block diagram illustrating a computer system 500 that utilizes a device package 510 (or semiconductor package) having an IHS, a STIM, a die, a first package substrate, LTS paste, solder balls, a BLUF, and a second package substrate, according to one embodiment. FIG. 5 illustrates an example of computing device 500. Computing device 500 houses motherboard 502. For one embodiment, motherboard 502 may be similar to the package substrates 102, 202, 302 of FIGS. 1-3. Motherboard 502 may include a number of components, including but not limited to processor 504, device package 510 (or semiconductor package), and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a substrate, a package substrate, and/or a PCB. Device package 510 may include a BGA STIM package as described herein. For example, the device package 510 may include an IHS, a STIM (or an indium STIM), a die, one or more package substrates, a LTS paste, solder balls, a BLUF, and/or a LTS joint reinforced paste (as illustrated in FIGS. 1-2)—or any other components from the figures described herein. Further, as described herein, the device package 510 may improve the thermal performance of the computing device 500 by enabling BGA/SMT reflows of the LTS paste, solder ball, and/or the pad to couple the one or more package substrates while preventing (or mitigating) the indium STIM from melting and causing voids (e.g., as shown with the semiconductor packages of FIGS. 1-2).

Note that device package 510 may be a single component/device, a subset of components, and/or an entire system, as the materials, features, and components may be limited to device package 510 and/or any other component of the computing device 500 that may need BGA packaging with improved thermal performances (e.g., the motherboard 502, the processor 504, and/or any other component of the computing device 500 that may need BGA STIM packaging with improved thermal performances as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package comprising of a die on a top surface of a package substrate; an integrated heat spreader (IHS) on the top surface of the package substrate. The IHS has a bottom surface positioned above the die; a solder thermal interface material (STIM) coupling a top surface of the die to the bottom surface of the IHS; and a low-temperature solder (LTS) paste comprising an alloy including tin (Sn) and bismuth (Bi), the LTS paste on a bottom surface of the package substrate. The LTS paste has a weight percentage of the Bi that is greater than approximately 43%. The LTS paste has a melting point that is less than or equal to a melting point of the STIM.

In example 2, the subject matter of example 1 can optionally include the STIM which includes indium (In).

The melting point of the LTS paste is approximately 139° Celsius (C). The melting point of the STIM is greater than or equal to 156° C. The weight percentage of the Bi is between approximately 43% to 58%.

In example 3, the subject matter of any of examples 1-2 can optionally include the bottom surface of the package substrate which includes a ball grid array (BGA). The BGA includes a pad.

In example 4, the subject matter of any of examples 1-3 can optionally include the top surface of the die which includes a backside metal (BSM) layer. The BSM layer is between the STIM and the die.

In example 5, the subject matter of any of examples 1-4 can optionally include a solder ball on the LTS paste on the bottom surface of the package substrate. The solder ball is an alloy of Sn, silver (Ag), and copper (Cu) (SAC). The solder ball is conductively coupled to the LTS paste and the pad on the bottom surface of the package substrate.

In example 6, the subject matter of any of examples 1-5 can optionally include the package substrate conductively couples the die to the pad, the LTS paste, and the solder ball. The melting point of the LTS paste is greater than or equal to 139° C.

In example 7, the subject matter of any of examples 1-6 can optionally include an electronic device on the bottom surface of the package substrate; the LTS paste on a top surface of a second package substrate; and an underfill between the bottom surface of the package substrate and the top surface of the second package substrate. The underfill surrounds the LTS paste, the solder ball, and the electronic device. The underfill has a curing temperature less than or equal to 135° C. The curing temperature of the underfill is less than the melting points of the LTS paste and the STIM.

In example 8, the subject matter of any of examples 1-7 can optionally include the solder ball conductively couples the LTS paste on the bottom surface of the package substrate to the LTS paste on the top surface of the second package substrate.

Example 9 is a method of forming a semiconductor package, comprising of disposing a STIM on a top surface of a die. The die is disposed on a top surface of a package substrate; disposing an IHS on the STIM and the top surface of the package substrate. The IHS has a bottom surface positioned above the STIM and the die. The STIM couples the top surface of the die to the bottom surface of the IHS; and disposing a LTS paste on a bottom surface of the package substrate, the LTS paste comprising an alloy including Sn and Bi. The LTS paste has a weight percentage of the Bi that is greater than approximately 43%. The LTS paste has a melting point that is less than or equal to a melting point of the STIM.

In example 10, the subject matter of example 9 can optionally include the STIM which includes In. The melting point of the LTS paste is approximately 139° C. The melting point of the STIM is greater than or equal to 156° C. The weight percentage of the Bi is between approximately 43% to 58%.

In example 11, the subject matter of any of examples 9-10 can optionally include the bottom surface of the package substrate which includes a BGA. The BGA includes a pad.

In example 12, the subject matter of any of examples 9-11 can optionally include prior to disposing the STIM on the top surface of the die, further comprising disposing a BSM layer on the top surface of the die. The BSM layer is disposed between the STIM and the die.

In example 13, the subject matter of any of examples 9-12 can optionally include disposing a solder ball on the LTS paste on the bottom surface of the package substrate; and thermally coupling the solder ball to the LTS paste at a first temperature between approximately 150° C. to 155° C. The solder ball is an alloy of SAC. The solder ball is conductively coupling the LTS paste to the pad on the bottom surface of the package substrate. The first temperature is less than the melting point of the STIM.

In example 14, the subject matter of any of examples 9-13 can optionally include the package substrate conductively coupling the die to the pad, the LTS paste, and the solder ball. The melting point of the LTS paste is greater than or equal to 139° C.

In example 15, the subject matter of any of examples 9-14 can optionally include disposing an electronic device on the bottom surface of the package substrate; disposing the LTS paste on a top surface of a second package substrate; disposing the solder ball onto the LTS paste on the top surface of the second package substrate; and thermally coupling the solder ball onto the LTS paste on the top surface of the second package substrate at a second temperature between approximately 150° C. to 155° C. The solder ball is conductively coupling the LTS paste on the bottom surface of the package substrate to the LTS paste on the top surface of the second package substrate. The second temperature is less than the melting point of the STIM.

In example 16, the subject matter of any of examples 9-15 can optionally include depositing an underfill between the bottom surface of the package substrate and the top surface of the second package substrate. The underfill surrounds the LTS paste, the solder ball, and the electronic device. The underfill has a melting point less than or equal to 135° C. The melting point of the underfill is less than the melting points of the LTS paste and the STIM.

Example 17 is a semiconductor package comprising of a die on a top surface of a package substrate. The package substrate includes an interposer; an IHS on the top surface of the package substrate. The IHS has a bottom surface positioned above the die; a STIM coupling a top surface of the die to the bottom surface of the IHS; a LTS paste comprising an alloy including Sn and Bi, the LTS paste on a bottom surface of the package substrate. The LTS paste has a weight percentage of the Bi that is between approximately 35% to 43%; and a LTS joint reinforced paste on and around the LTS paste and the bottom surface of the package substrate. The LTS joint reinforced paste includes an epoxy, a flux, and a metal powder.

In example 18, the subject matter of example 17 can optionally include the STIM which includes In. The LTS paste has a second weight percentage of the Bi that is between approximately 36% to 43%. The LTS paste having the second weight percentage of the Bi has a melting point that is less than or equal to a melting point of the STIM. The melting point of the LTS paste having the second weight percentage of the Bi is between approximately 139° C. to 155° C. The melting point of the STIM is greater than or equal to 156° C.

In example 19, the subject matter of any of examples 17-18 can optionally include the bottom surface of the package substrate which includes a BGA. The BGA includes a pad.

In example 20, the subject matter of any of examples 17-19 can optionally include the top surface of the die which includes a BSM layer. The BSM layer is between the STIM and the die.

In example 21, the subject matter of any of examples 17-20 can optionally include a solder ball on the LTS joint reinforced paste and the LTS paste on the bottom surface of the package substrate. The solder ball is an alloy of SAC. The solder ball is conductively coupled to the LTS joint reinforced paste, the LTS paste, and the pad on the bottom surface of the package substrate.

In example 22, the subject matter of any of examples 17-21 can optionally include the package substrate conductively coupling the die to the pad, the LTS joint reinforced paste, the LTS paste, and the solder ball. The melting point of the LTS paste is approximately equal to a melting point of the LTS joint reinforced paste.

In example 23, the subject matter of any of examples 17-22 can optionally include an electronic device on the bottom surface of the package substrate; and the LTS paste on a top surface of a second package substrate. The second package substrate includes a printed circuit board (PCB).

In example 24, the subject matter of any of examples 17-23 can optionally include the solder ball conductively coupling the LTS paste and the LTS joint reinforced paste on the bottom surface of the package substrate to the LTS paste on the top surface of the second package substrate.

In example 25, the subject matter of any of examples 17-24 can optionally include the STIM having a viscosity drop percentage of less than or equal to 4% at a temperature between approximately 160° C. to 175° C.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
   a die on a top surface of a package substrate;
   an integrated heat spreader (IHS) on the top surface of the package substrate, wherein the IHS has a bottom surface positioned above the die;
   a solder thermal interface material (STIM) coupling a top surface of the die to the bottom surface of the IHS;
   a low-temperature solder (LTS) paste comprising an alloy including tin (Sn) and bismuth (Bi), the LTS paste on a bottom surface of the package substrate, wherein the LTS paste has a weight percentage of the Bi that is greater than approximately 43%, and wherein the LTS paste has a melting point that is 10° C. to 15° C. less than a melting point of the STIM; and
   a solder ball on the LTS paste on the bottom surface of the package substrate, wherein the solder ball is in direct physical contact with the LTS paste.

2. The semiconductor package of claim 1, wherein the bottom surface of the package substrate includes a ball grid array (BGA), and wherein the BGA includes a pad.

3. The semiconductor package of claim 1, wherein the top surface of the die includes a backside metal (BSM) layer, and wherein the BSM layer is between the STIM and the die.

4. The semiconductor package of claim 2, wherein the solder ball is an alloy of Sn, silver (Ag), and copper (Cu) (SAC), and wherein the solder ball is conductively coupled to the pad on the bottom surface of the package substrate.

5. The semiconductor package of claim 4, wherein the package substrate conductively couples the die to the pad, the LTS paste, and the solder ball, and wherein the melting point of the LTS paste is greater than or equal to 139° C.

6. The semiconductor package of claim 4, further comprising:
   an electronic device on the bottom surface of the package substrate;
   the LTS paste on a top surface of a second package substrate; and
   an underfill between the bottom surface of the package substrate and the top surface of the second package substrate, wherein the underfill surrounds the LTS paste, the solder ball, and the electronic device, wherein the underfill has a curing temperature less than or equal to 135° C., and wherein the curing temperature of the underfill is less than the melting points of the LTS paste and the STIM.

7. The semiconductor package of claim 4, wherein the solder ball conductively couples the LTS paste on the bottom surface of the package substrate to the LTS paste on the top surface of the second package substrate.

8. A semiconductor package, comprising:
   a die on a top surface of a package substrate, wherein the package substrate includes an interposer;
   an integrated heat spreader (IHS) on the top surface of the package substrate, wherein the IHS has a bottom surface positioned above the die;
   a solder thermal interface material (STIM) coupling a top surface of the die to the bottom surface of the IHS;
   a low-temperature solder (LTS) paste comprising an alloy including Sn and Bi, the LTS paste on a bottom surface of the package substrate, wherein the LTS paste has a weight percentage of the Bi that is between approximately 35% to 58%, wherein the LTS paste has a melting point that is 10° C. to 15° C. less than a melting point of the STIM;
   a low-temperature solder (LTS) joint reinforced paste on and around the LTS paste and the bottom surface of the package substrate, wherein the LTS joint reinforced paste includes an epoxy, a flux, and a metal powder; and
   a solder ball on the LTS paste on the bottom surface of the package substrate, wherein the solder ball is in direct physical contact with the LTS paste and with the LTS joint reinforced paste.

9. The semiconductor package of claim 8, wherein the bottom surface of the package substrate includes a ball grid array (BGA), and wherein the BGA includes a pad.

10. The semiconductor package of claim 8, wherein the top surface of the die includes a backside metal (BSM) layer, and wherein the BSM layer is between the STIM and the die.

11. The semiconductor package of claim 9, wherein the solder ball is an alloy of Sn, µg and Cu, and wherein the solder ball is conductively coupled to the pad on the bottom surface of the package substrate.

12. The semiconductor package of claim 11, wherein the package substrate conductively couples the die to the pad, the LTS joint reinforced paste, the LTS paste, and the solder ball, and wherein the melting point of the LTS paste is approximately equal to a melting point of the LTS joint reinforced paste.

13. The semiconductor package of claim 11, further comprising:
   an electronic device on the bottom surface of the package substrate; and
   the LTS paste on a top surface of a second package substrate, wherein the second package substrate includes a printed circuit board (PCB).

14. The semiconductor package of claim 11, wherein the solder ball conductively couples the LTS paste and the LTS joint reinforced paste on the bottom surface of the package substrate to the LTS paste on the top surface of the second package substrate.

15. The semiconductor package of claim 8, wherein the STIM has a viscosity drop percentage of less than or equal to 4% at a temperature between approximately 160° C. to 175° C.

* * * * *